(12) United States Patent
You

(10) Patent No.: US 7,136,314 B2
(45) Date of Patent: Nov. 14, 2006

(54) MEMORY DEVICE AND TEST METHOD THEREOF

(75) Inventor: Min Young You, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 49 days.

(21) Appl. No.: 11/008,273

(22) Filed: Dec. 10, 2004

(65) Prior Publication Data

US 2006/0072362 A1    Apr. 6, 2006

(30) Foreign Application Priority Data

Oct. 4, 2004    (KR) ............... 10-2004-0078775

(51) Int. Cl.
   *G11C 7/00*    (2006.01)
(52) U.S. Cl. ..................... 365/201; 365/210
(58) Field of Classification Search .......... 365/200, 365/201, 205, 207, 210
   See application file for complete search history.

(56) References Cited

U.S. PATENT DOCUMENTS

| | | | |
|---|---|---|---|
| 5,339,273 A * | 8/1994 | Taguchi ............... 365/201 |
| 5,848,017 A * | 12/1998 | Bissey ............... 365/201 |
| 5,991,189 A * | 11/1999 | Miwa ............... 365/201 |
| 6,144,597 A * | 11/2000 | Kim ............... 365/201 |
| 6,185,138 B1 * | 2/2001 | Brady ............... 365/201 |
| 6,285,608 B1 | 9/2001 | Roohparvar | |
| 6,330,203 B1 | 12/2001 | Earl | |
| 6,424,142 B1 * | 7/2002 | Kato et al. ............... 324/158.1 |
| 6,430,094 B1 * | 8/2002 | Waller ............... 365/201 |
| 6,551,846 B1 | 4/2003 | Furutani et al. | |
| 6,704,231 B1 | 3/2004 | Morishita et al. | |
| 6,754,094 B1 * | 6/2004 | McClure ............... 365/201 |
| 2002/0034112 A1 | 3/2002 | Kato et al. | |
| 2004/0204891 A1 | 10/2004 | Horihata et al. | |

FOREIGN PATENT DOCUMENTS

| | | |
|---|---|---|
| JP | 2000-011694 | 1/2000 |
| JP | 2004-152399 | 5/2004 |

* cited by examiner

*Primary Examiner*—Richard Elms
*Assistant Examiner*—Alexander Sofocleous
(74) *Attorney, Agent, or Firm*—Heller Ehrman LLP

(57) ABSTRACT

A memory device and a test method thereof enable verification of failure of a cell region by intercepting bit lines connected to the cell region in a write-verify-read test. The memory device comprises a plurality of bit line switches and a separation control unit. The bit line switches connect the bit lines of the bit line sense amplifier to those of the selected cell array in response to a bit line separation control signal in a normal mode, separate the bit lines of the bit line sense amplifier from those of the unselected cell array, and separate the bit lines of the bit line sense amplifier from those of the cell array in response to the bit line separation control signal in a test mode. The separation control unit disables the bit line separation control signal in response to a test mode signal in the test mode.

3 Claims, 2 Drawing Sheets

MEMORY DEVICE AND TEST METHOD THEREOF

BACKGROUND ART

1. Field of the Invention

The present invention generally relates to a memory device and a test method thereof, and more specifically, to a technology of verifying failure of a cell region by intercepting a bit line connected to the cell region in a write-verify-read test performed to verify a normal operation of peripheral circuits other than the cell region.

2. Description of the Prior Art

Generally, operation modes supported by an integrated circuit device or a memory device include a user mode supported for users and a test mode for analysis of operation characteristics of a chip by a chip maker.

FIG. 1 is a block diagram illustrating a conventional memory device.

The conventional memory device comprises a cell array block 2, a bit line sense amplifier 4, a bit line switch 6 and a peripheral circuit 8. Also, the memory device comprises a plurality of bit lines BL0~BLn, a dummy bit line BLD set as a bit line precharge voltage VBLP, and a dummy sub word line SWLD set as a ground voltage VSS.

The cell array 2 includes a plurality of memory cells (not shown) arranged in a matrix and a plurality of sub word lines SWLL and SWLR.

The bit line sense amplifier 4 senses and amplifies data in the bit lines BL0~BLn.

The bit line switch 6 selectively separates the bit lines BL0~BLn of the bit line sense amplifier 4 from those of the cell array 2 in response to separation control signals SHLB and SHRB.

The peripheral circuit 8 externally outputs data amplified by the bit line sense amplifier 4 through an input/output bus IOBUS or transmits externally inputted data to the bit line sense amplifier 4.

When a write-verify-read test is performed on the above-described memory device, all of the cell array 2, the bit line sense amplifier 4 and the peripheral circuit 8 (A in FIG. 1) are operated in the same way as in a normal operation.

Here, the bit line switch 6 connects the bit lines BL0~BLn of the bit line sense amplifier 4 to those of the selected cell array.

If the bit lines BL0~BLn of the bit line sense amplifier 4 are not separated from those of the cell array 2 when the bit lines BL0~BLn connected to the cell array 2 and the bit line sense amplifier 4 are connected with other lines, for example, a ground line GND or other nodes than a drain of a cell transistor (not shown) to cause failure, the same failure is represented in the cell array 2, so that failure of the peripheral circuit 8 and the bit line sense amplifier 4 cannot be verified.

When the main bit lines BL0~BLn and a dummy bit line BLD are connected to dummy word lines WLLD and SWRD set at a ground level VSS (short), the bit line switches 4 should all be turned off for verification of the connection state. However, it is impossible to turn off all bit line switches 4 in a common memory device.

SUMMARY OF THE INVENTION

Accordingly, it is an object of the present invention to reduce design analysis time with a test mode signal in a write-verify-read test to search an analysis point.

It is another object of the present invention to verify failure of a bit line sense amplifier or a peripheral circuit by separating bit lines of the bit line sense amplifier from those of a cell array with a test mode signal in a write-verify-read test.

It is still another object of the present invention to verify failure generated from a dummy word line connected to a main bit line and a dummy bit line by turning off all bit line switches with a test mode signal in a write-verify-read test.

In an embodiment, a memory device comprises a plurality of cell arrays, a plurality of bit line sense amplifiers, a plurality of bit line switches and a separation control unit. Each of the plurality of cell arrays comprises a plurality of memory cells and a plurality of normal sub word lines which are arranged in a matrix type. The plurality of bit line sense amplifiers sense and amplify data in a plurality of bit lines. The plurality of bit line switches selectively connect the bit lines of the bit line sense amplifier to those of the cell array selected in response to a bit line separation control signal in a normal mode, selectively separate the bit lines of the bit line sense amplifier from those of the unselected cell array, and selectively separate the bit lines of the bit line sense amplifier from those of the cell array in response to the bit line separation control signal in a test mode. The separation control unit disables the bit line separation control signal in response to a test mode signal in the test mode.

In an embodiment, a method for testing a memory device comprises: a first step of connecting bit lines of a bit line sense amplifier to those of a cell array selected in a normal mode, and separating the bit lines of the bit line sense amplifier from those of an unselected cell array; and a second step of separating bit lines of the bit line sense amplifier from those of all cell arrays in response to a test mode signal in a test mode.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
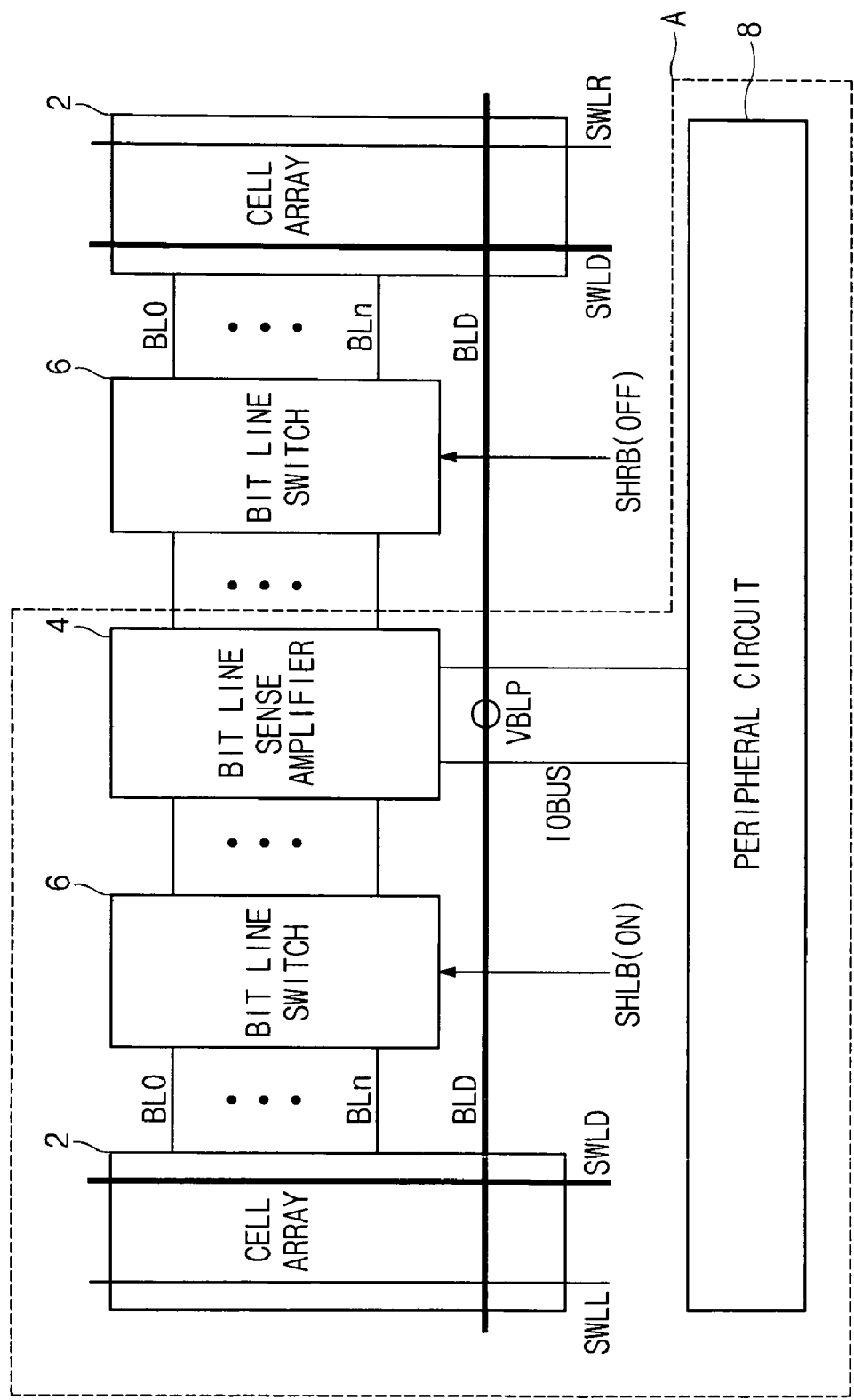
FIG. 1 is a block diagram illustrating a conventional memory device.
Figure 2:
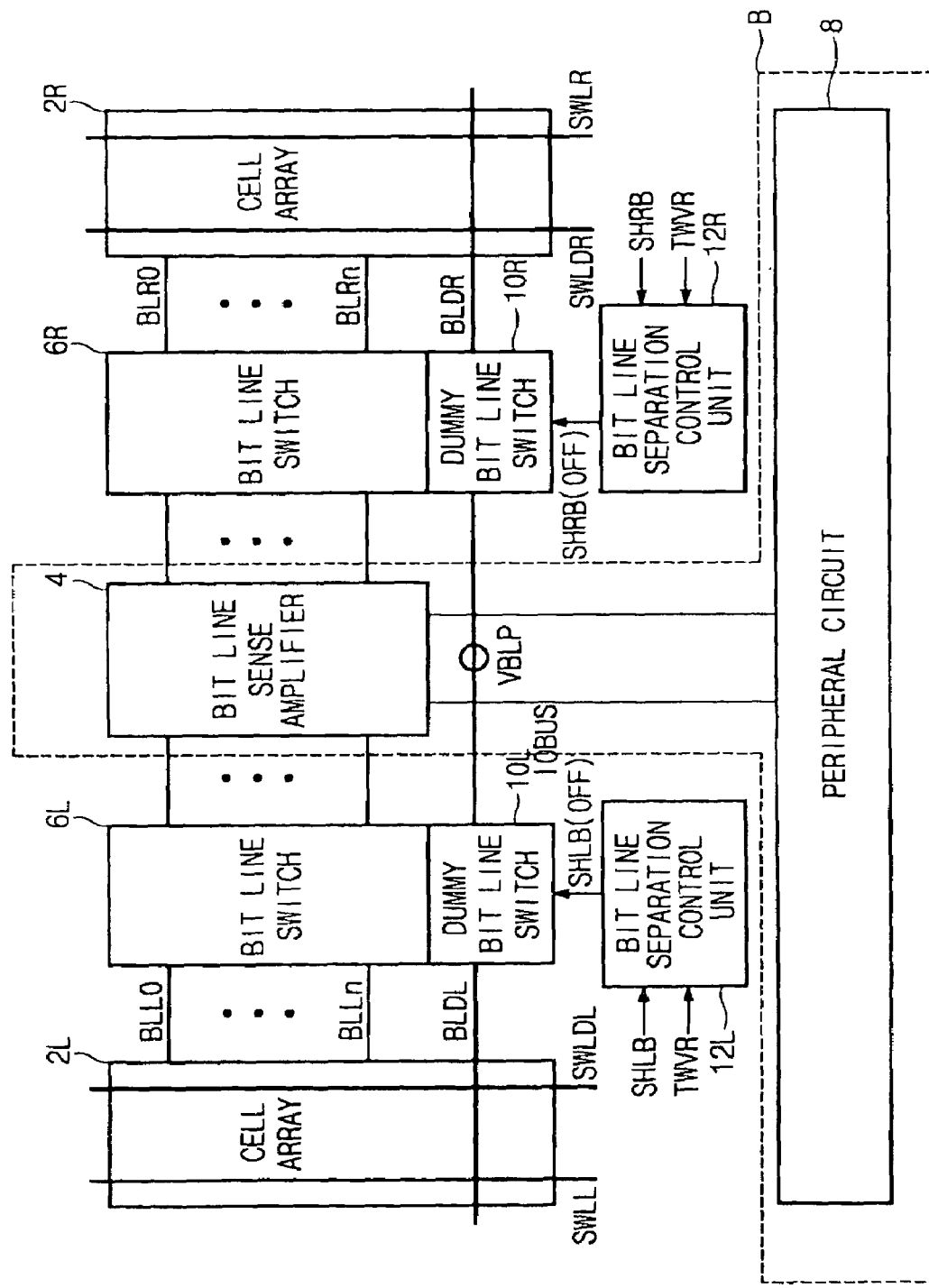
FIG. 2 is a block diagram illustrating a memory device according to an embodiment of the present invention.

FIG. 2 is a block diagram illustrating a memory device according to an embodiment of the present invention.

In an embodiment, the memory device comprises a cell array block 2L, 2R, a bit line sense amplifier 4, a bit line switch 6L, 6R, a peripheral circuit 8, a dummy bit line switch 10L, 10R and a bit line separation control unit 12L, 12R. Also, the memory device comprises a plurality of bit lines BLL0~BLLn, BLR0~BLRn, a dummy bit line set at a bit line precharge voltage VBLP and a dummy sub word line SWLDL, SWLDR set at a ground voltage VSS.

The cell array 2 includes a plurality of memory cells (not shown) arranged in a matrix, and a plurality of main sub word lines SWLL and SWLR.

The bit line sense amplifier 4 senses and amplifies data in the bit lines BLL0~BLLn, BLR0~BLRn.

In a normal operation mode, the bit line switch 6 selectively connects the bit lines BLL0~BLLn, BLR0~BLRn of the bit line sense amplifier 4 to those of the cell array 2L, 2R selected in response to separation control signals SHLB and SHRB, and selectively separates the bit lines BLL0~BLLn, BLR0~BLRn of the bit line sense amplifier 4 from those of the unselected cell array 2L, 2R. The dummy bit line switch 10L, 10R selectively connects a dummy bit line BLDL, BLDR of the bit line sense amplifier 4 to that of the cell array 2L, 2R selected in response to the separation control signals SHLB and SHRB, and selectively separates the dummy bit line BLDL, BLDR of the bit line sense amplifier 4 from that of the unselected cell array 2L, 2R.

Meanwhile, in a write-verify-read test, all of the bit line switches 6L, 6R selectively separate the bit lines BLL0~BLLn, BLR0~BLRn of the bit line sense amplifier 4 from those of the cell array 2L, 2R in response to the bit line separation signals SHLB and SHRB. The dummy bit line switch 10L, 10R selectively separates the dummy bit line BLDL, BLDR of the bit line sense amplifier 4 from that of the cell array 2L, 2R in response to the bit line separation signals SHLB and SHRB.

The peripheral circuit 8 externally outputs data amplified by the bit line sense amplifier 4 through an input/output bus IOBUS or transmits externally inputted data to the bit line sense amplifier 4.

In the normal mode, the bit line separation control unit 12 transmits the bit line separation signals SHLB and SHRB regardless of a write-verify-read test mode signal TWVR. However, in the write-verify-read test, the bit line separation control unit 12L, 12R sets the bit line switch 6L, 6R and the dummy bit line switch 10L, 10R to be in a turned-off state by setting the bit line separation signals SHLB and SHRB at a low level in response to the write-verify-read test mode signal TWVR.

When a write-verify-read test is performed without using the write-verify-read test mode signal in the above-described memory device, the bit line sense amplifier 4 and the peripheral circuit 8 (B in FIG. 2) are all operated in the same way as the normal operation.

Here, the bit line switch 6L, 6R connects the bit lines BLL0~BLLn, BLR0~BLRn of the bit line sense amplifier 4 to those of the selected cell array 2L, 2R.

Meanwhile, when the write-verify-read test is performed, all of the bit line switches 6L, 6R and the dummy bit line switch 10L, 10R are turned off by the bit line separation signals SHLB and SHRB with the write-verify-read test mode signal TWVR. As a result, the peripheral circuit 8 and the bit line sense amplifier 4 (B in FIG. 2) are verified to judge failure of the cell array 2.

Also, when the write-verify-read test mode signal TWVR is used, all of the bit line switches 6L, 6R and the dummy bit line switch 10L, 10R are turned off to verify failure generated from the dummy word line SWLDL, SWLDR connected to the main bit lines BLL0~BLLn, BLR0~BLRn and the dummy bit line BLDL, BLDR.

As discussed earlier, a memory device according to an embodiment of the present invention has an effect to reduce design analysis time with a test mode signal in a write-verify-read test to search an analysis point.

Also, the memory device has another effect to verify failure of a bit line sense amplifier or a peripheral circuit by separating bit lines of the bit line sense amplifier from those of a cell array with a test mode signal in a write-verify-read test.

Additionally, the memory device has still another effect to verify failure generated from a dummy word line connected to a main bit line and a dummy bit line by turning off all bit line switches with a test mode signal in a write-verify-read test.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device comprising:
   a plurality of cell arrays each comprising a plurality of memory cells and a plurality of normal sub word lines which are arranged in a matrix;
   a plurality of bit line sense amplifiers for sensing and amplifying data in a plurality of bit lines;
   a plurality of bit line switches for selectively connecting the bit lines of the bit line sense amplifier to those of the cell array selected in response to a bit line separation control signal in a normal mode, selectively separating the bit lines of the bit line sense amplifier from those of the unselected cell array, and selectively separating the bit lines of the bit line sense amplifier from those of the cell array in response to the bit line separation control signal in a test mode;
   a plurality of dummy bit line switches each for selectively connecting dummy bit lines of the bit line sense amplifier to those of the cell array selected in response to the separation control signal in the normal mode, selectively separating the dummy bit lines of the bit line sense amplifier from those of the unselected cell array, and selectively separating the dummy bit lines of the bit line sense amplifier from those of the cell array in response to the separation control signal in the test mode; and
   a separation control unit for disabling the bit line separation control signal in response to a test mode signal in the test mode.

2. The memory device according to claim 1, wherein the dummy bit line is set with a bit line precharge voltage.

3. A method for testing a memory device, comprising:
   a first step of connecting bit lines of a bit line sense amplifier to those of a cell array selected in a normal mode, and separating the bit lines of the bit line sense amplifier from those of an unselected cell array, and
   a second step of separating bit lines of the bit line sense amplifier from those of all cell arrays in response to a test mode signal in a test mode;
   a third step of connecting dummy bit lines of a bit line sense amplifier to those of a cell array selected in the first step, and separating the dummy bit lines of the bit line sense amplifier from an unselected cell array; and
   a fourth step of separating the dummy bit lines of the bit line sense amplifier from those of all cell arrays in response to the test mode signal in the test mode.

* * * * *